United States Patent [19]

DeKoning et al.

[11] Patent Number: 5,588,110
[45] Date of Patent: Dec. 24, 1996

[54] METHOD FOR TRANSFERRING DATA BETWEEN TWO DEVICES THAT INSURES DATA RECOVERY IN THE EVENT OF A FAULT

[75] Inventors: Rodney A. DeKoning; Donald R. Humlicek; Max L. Johnson, all of Wichita, Kans.

[73] Assignee: Symbios Logic Inc., Fort Collins, Colo.

[21] Appl. No.: 447,377

[22] Filed: May 23, 1995

[51] Int. Cl.⁶ .................................................. G06F 13/14
[52] U.S. Cl. ........................... 395/182.03; 395/483
[58] Field of Search ...................... 395/180, 181, 395/182.03, 182.07, 427, 471, 483; 371/7, 40.1, 51.1; 364/242.3, 242.33

[56] References Cited

U.S. PATENT DOCUMENTS

| | | | |
|---|---|---|---|
| 5,212,784 | 5/1993 | Sparks | 364/200 |
| 5,274,645 | 12/1993 | Idleman et al. | 371/40.1 |
| 5,341,493 | 8/1994 | Yanai et al. | 364/200 |
| 5,377,342 | 12/1994 | Sakai et al. | 364/200 |
| 5,398,324 | 3/1995 | Matida et al. | 364/200 |
| 5,448,719 | 9/1995 | Schultz et al. | 395/182.03 |

Primary Examiner—Robert W. Beausoliel, Jr.
Assistant Examiner—Albert Décady
Attorney, Agent, or Firm—Paul J. Maginot

[57] ABSTRACT

A method of insuring recovery of a quantity write request data in a storage device having a plurality of controllers includes the steps of (1) providing a primary controller for storing the write request data received from a host device, (2) providing an alternate controller having a memory area allocated for use by the primary controller, (3) maintaining a first control block in the primary controller for indicating status of the write request data stored in the primary controller, and (4) maintaining a second control block in the alternate controller for indicating status of the write request data stored in the primary controller.

31 Claims, 4 Drawing Sheets

METHOD FOR TRANSFERRING DATA BETWEEN TWO DEVICES THAT INSURES DATA RECOVERY IN THE EVENT OF A FAULT

BACKGROUND OF THE INVENTION

The present invention relates generally to a method for transferring data, and more particularly to a method for transferring data between two devices that insures that the data can be recovered in the event of a fault such as a power failure, controller failure, or any other fault in which data could be lost.

Write-back caching is an exemplary environment for transferring data from an initiator device to a target device. Write-back caching refers to a method of executing write requests where a host computer transfers write request data to a caching disk array controller which then transfers the write request data to storage media. Depending upon the particular write-back caching strategy being implemented by the controller, the write request data can either be written immediately to the storage media, or the write request data can be temporarily stored in a cache memory as unwritten or "dirty data" and then "flushed" or written to the storage media at some later point in time. In both cases, the controller sends back status information to the host computer indicating that the write request is complete so that the host computer can continue executing a software application. What is meant herein by the use of the term "dirty data" is data that is located in cache memory which has not yet been written to storage media. To provide meaning to the following terms "flush", "flushed" or "flushing" which are used herein, it should be appreciated that the act of "flushing" data means writing dirty data to storage media.

In bursty host computer environments, such as when the host computer intermittently has a large number of write requests, write-back caching permits the host computer to quickly transfer all of the write request data to cache memory thus increasing the performance of the host computer by reducing the host computer's overhead in executing the large number of write requests. The increased performance of the host computer when utilizing write-back caching is accompanied by an increased risk of data loss in the event of a controller failure or the like which may occur subsequent to sending the host computer status information but prior to actually writing the data to storage media. Intermediate levels of write request data protection have been developed which involve the use of controller pairs that mirror the write request data for redundancy purposes prior to sending status to the host computer.

When using two controllers to mirror write request data, a primary controller receives a write request from a host computer. The primary controller then instructs a target or alternate controller to store a copy of the write request data into a cache memory area of the alternate controller for redundancy purposes before the primary controller sends status information to the host computer, and before the primary controller places the data on the storage media. Unfortunately, there is always the risk that a fault could occur at any point in the mirroring process whereby data is lost thus leaving the mirrored data representation in an ambiguous state that would make recovery of the data by either controller impossible. What is needed therefore is a method for mirroring data between a primary controller and an alternate controller that ensures that the data can be recovered at any point in the mirroring process without leaving the mirrored data representation in an ambiguous state.

SUMMARY OF THE INVENTION

In accordance with one embodiment of the present invention, there is provided a method of insuring recovery of a quantity of write request data in a multi-controller storage device. The method includes the steps of (1) providing a first controller for storing the write request data received from a host device, (2) providing a second controller having a memory area allocated for use by the first controller, and (3) maintaining a control block in the second controller for indicating status of the write request data stored in the first controller.

Pursuant to another embodiment of the present invention, there is provided a method of insuring recovery of a quantity write request data in a storage device having a plurality of controllers. The method includes the steps of (1) providing a primary controller for storing the write request data received from a host device, (2) providing an alternate controller having a memory area allocated for use by the primary controller, (3) maintaining a first control block in the primary controller for indicating status of the write request data stored in the primary controller, and (4) maintaining a second control block in the alternate controller for indicating status of the write request data stored in the primary controller.

It is therefore an object of the present invention to provide a new and useful method for insuring recovery of write request data in a multi-controller storage device.

It is another object of the present invention to provide an improved method for insuring recovery of write request data in a storage device having a plurality of controllers.

The above and other objects, features, and advantages of the present invention will become apparent from the following description and the attached drawings.

DETAILED DESCRIPTION OF THE PREFERRED EMBODIMENT

Figure 1:
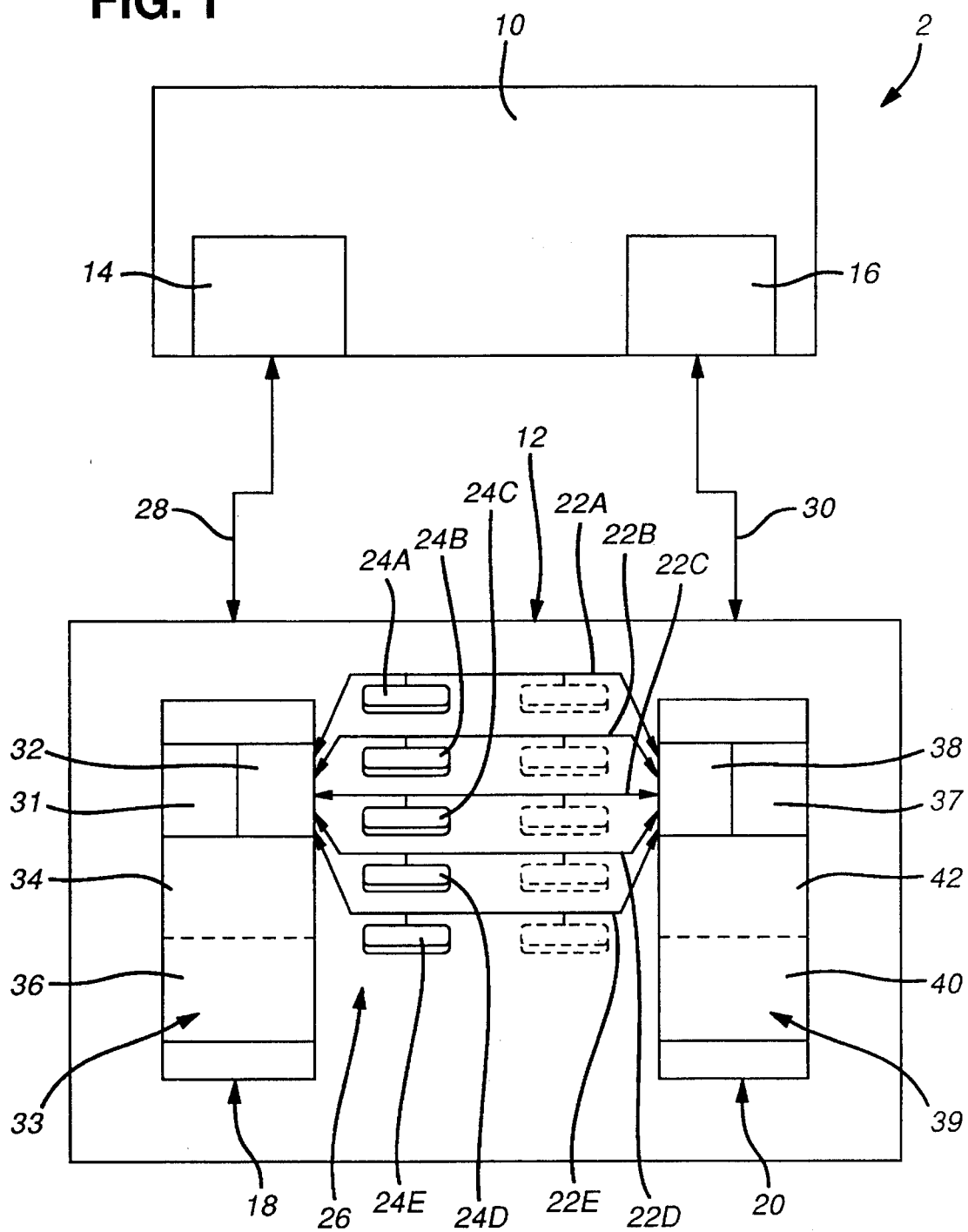
FIG. 1 is a block diagram of a computer system with a multi-controller disk array apparatus which mirrors data in accordance with the method of the present invention.

While the invention is susceptible to various modifications and alternative forms, a specific embodiment thereof has been shown by way of example in the drawings and will herein be described in detail. It should be understood, however, that there is no intent to limit the invention to the particular form disclosed, but on the contrary, the intention is to cover all modifications, equivalents, and alternatives falling within the spirit and scope of the invention as defined by the appended claims.

Referring now to FIG. 1, there is shown a computer system 2 comprising a host computer 10 and a peripheral disk drive apparatus 12 connected to the host computer 10. The host computer 10 includes a first host adapter 14 and a second host adapter 16 which both function to interface the host computer 10 to various peripheral devices such as the disk drive apparatus 12.

The disk drive apparatus 12 includes a first caching disk array controller 18, a second caching disk array controller 20, a plurality of back-end buses such as SCSI channels 22A–22E which interconnect the first controller 18 to the second controller 20, and at least one storage medium such as a data disk 24A–24E connected to each of the buses 22A–22E. SCSI is an acronym for a Small Computer System Interface which defines a communications protocol standard for input/output devices. The first version of the standard, SCSI-1, is described in ANSI Document No. X3.131-1986 which is incorporated herein by reference. The SCSI-1 specification has been upgraded with an expanded interface referred to as SCSI-2. The SCSI-2 specification is described in ANSI Document No. X3.131-1994 which is also incorporated herein by reference.

In the described embodiment, there are five disks 24A–24E which cooperate to form a one-column disk array 26, and which are individually connected to the controllers 18, 20 via the buses 22A–22E, respectively. The disk array 26 incorporates a design termed "Redundant Array of Inexpensive Disks" (RAID). Five levels of RAID design, termed RAID-1 through RAID-5, are known in the art and are described in the publication titled "A Case for Redundant Arrays of Inexpensive Disks (RAID)" by David A. Patterson, Garth Gibson and Randy H. Katz; University of California Report No. UCB/CSD 87/391, December 1987, which is incorporated herein by reference. It should be appreciated that the disk array 26 can include additional columns of disks connected to the respective buses 22. For example, a 5 by 6 disk array comprising thirty (30) disk drives can be formed by connecting 5 additional disks to each bus 22A–22E, respectively.

The host computer 10, and more particularly, the host adapters 14, 16 are connected to the respective disk array controllers 18, 20 via separate buses such as host SCSI buses 28 and 30. The first controller 18 includes a data processor such as a microprocessor 31, an input/output processor 32 and a cache memory 33. The cache memory 33 can be partitioned into at least two separate areas comprising a primary cache memory area 34 and an alternate cache memory area 36. Likewise, the second controller 20 includes a data processor such as a microprocessor 37, an input/output processor 38 and a cache memory 39 which is partitioned into at least two separate areas comprising a primary cache memory area 40 and an alternate cache memory area 42.

The input/output processors 32, 38 execute ASIC-specific (Application Specific Integrated Circuit) instructions independent from controller firmware which is executed by the respective microprocessors 31, 37. One example of a suitable input/output processor is the SCSI Input/Output Processor (SLOP) 53C825 chip manufactured by Symbios Logic Inc. of Fort Collins, Colo. The 53C825 input/output processor executes SCRIPTS instructions which are an ASIC-specific instruction set specifically designed for controlling the 53C8XX family of Symbios Logic Inc. products.

The controllers 18, 20 can operate in one of two modes, passive-active or dual-active. In the dual-active mode of operation, both controllers 18, 20 have portions of their respective cache memories 33, 39 allocated for exclusive use by the other controller. Thus, in the dual-active mode, both controllers 18, 20 function as a primary controller and an alternate controller. More specifically, the primary cache memory area 34 is assigned to controller 18 for use during cache read/write requests from the host computer 10, and the alternate cache memory area 36 is assigned to controller 20 for use in mirroring write request data which is stored in the primary cache memory area 40 of controller 20. Controller 20 is responsible for managing the write request data that it mirrors or stores in the alternate cache memory area 36.

Likewise, the primary cache memory area 40 is assigned to controller 20 for use during cache read/write requests from the host computer 10, and the alternate cache memory area 42 is assigned to controller 18 for use in mirroring write request data which is stored in the primary cache memory area 34 of controller 18. Controller 18 is responsible for managing the write request data that it mirrors into the alternate cache memory area 42.

The alternate cache memory areas 42, 36 are allocated to the respective controllers 18, 20 during the system configuration phase of start-up operations for the computer system 2. It should be appreciated that the alternate cache memory area 42 is assigned the same corresponding memory addresses as assigned to the primary cache memory area 34, and that the alternate cache memory area 36 is assigned the same corresponding memory addresses as assigned to the primary cache memory area 40 thus simplifying mirroring operations by avoiding the need for virtual memory mapping operations.

In the passive-active mode of operation, one of the controllers, such as controller 18, functions as a primary controller which receives read/write requests from the host computer 10 while the other controller, controller 20, functions as an alternate controller which provides cache memory for mirroring the write request data under the direction of the primary controller 18 as described above with regard to the dual-active mode of operation.

It should be appreciated that the alternate cache memory area 36 does not have to be the same size as the primary cache memory area 40, and that the alternate cache memory area 42 does not have to be the same size as the primary cache memory area 34. By way of example, the alternate cache memory area 42 has to only be large enough to handle all of the mirrored write request data that controller 18 wants to store. At any given time, the primary cache memory area 34, and similarly, the primary cache memory area 40, has X% of read cache, Y% of write cache and Z% of unused memory allocated thereto, where X+Y+Z=100% of the primary cache memory area 34. If the maximum amount of write request data (Y% of write cache) that can be stored in the primary cache memory area 34 is less than 100% of the primary cache memory area 34, then the alternate cache memory area 42 can be smaller than the primary cache memory area 34. That is, the alternate cache memory area 42 need only be as large as the amount of the primary cache memory area 34 allocated for write caching.

Referring now to FIGS. 2–8, there is shown a recovery control block data structure, state diagrams and flow charts which facilitate describing the method of the present invention. For ease of description, further reference will be limited to mirroring unwritten cache data from the primary cache memory area 34 to the alternate cache memory area 42. However, it is to be understood that mirroring unwritten cache data from the primary cache memory area 40 to the alternate cache memory area 36 occurs in an analogous manner.

Data is conventionally managed within the cache memory 33 by partitioning at least the primary cache memory area 34 into a number of cache blocks each comprising a predetermined amount of cache memory. Each cache block is further partitioned into a number of contiguous sectors which also comprise a predetermined amount of cache memory. For example, a typical 2 Mbyte cache memory may be partitioned into 128 cache blocks with each cache block representing 16 Kbytes of cache memory. Note that each cache block can be further partitioned into 32 contiguous sectors with each sector representing 512 bytes of cache memory.

When the controller 18 receives a request from the host computer 10 to write a contiguous block of data to storage media, the controller 18 initially determines whether or not the write request data is stored in the primary cache memory area 34 as dirty data (i.e. data not yet written to storage media). If dirty data is stored in the primary cache memory area 34, then the controller 18 overwrites the dirty data with the write request data. If dirty data is not stored in the primary cache memory area 34, then the controller 18 stores the write request data in available sectors throughout one or more of the cache blocks forming the primary cache memory area 34.

In either case, the controller 18 sets up auxiliary data structures within the primary cache memory area 34 referred to as a recovery control blocks (RCBs) 44. Each cache block of the primary cache memory area 34 that contains write request data will have a corresponding RCB 44 associated therewith. As discussed further below, when the controller 18 mirrors one or more cache blocks containing write request data to the alternate cache memory area 42, the associated RCB(s) 44 will first be mirrored into an alternate controller recovery control block(s) (RCB) 45. Like the RCBs 44, the RCBs 45 correspond to the cache blocks in the alternate cache memory area 42 that contain the mirrored write request data. That is, identical RCBs 44, 45 are maintained and updated for each cache block in the primary and alternate cache memory areas 34, 42 that contains write request data which has not been written to storage media. The RCBs 44, 45 provide for the recovery of cache data in the event of a power failure, a controller take-over sequence, or in any other situation where data must be recovered, restored, rebuilt, or the like.

Figure 2:
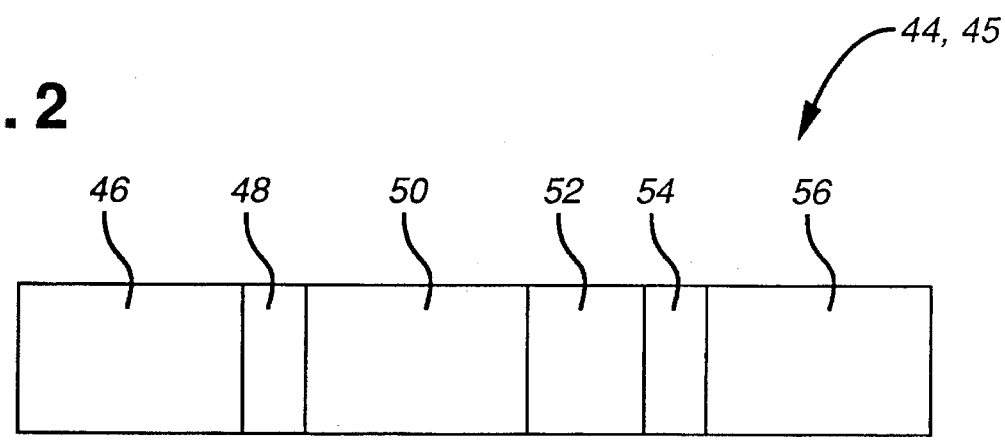
FIG. 2 is a block diagram illustrating a recovery control block data structure for use in practicing the method of the present invention.

FIG. 2 is an exemplary illustration of the RCB data structures 44, 45. It should be appreciated that the RCB data structures could contain fields other than those described below. In the embodiment being described, the RCB data structures 44, 45 comprise five data fields, namely, a four-byte mirrored memory map (MM) field 46, a one-byte virtual disk number field 48, a four-byte host logical block address (LBA) field 50, a two-byte flag word field 52, a one-byte parity-in-progress block pointer field 54, and a 4-byte dirty bit map (DM) field 56.

The MM field 46 contains a bit for bit representation of each sector in the cache block represented by the RCB. The MM field 46 indicates which sectors within the particular cache block represented by the RCB contain unmirrored write request data as described further below. The virtual disk number field 48 contains the virtual disk number with which to associate the write request data. The host LBA field 50 contains the host LBA for the logical unit. The Flag word field 52 contains assorted flags that are identified with parity and describe the cache block usage. The parity-in-progress field 54 indicates for which cache data block this parity block is being generated. The field 54 contains a pointer to the first block in a stripe for which parity is being generated. The DM field 56 contains a bit-for-bit representation of each sector in the cache block represented by the RCB. The DM field 56 indicates which sectors within the particular cache block represented by the RCB contain unwritten or dirty write request data as described further below.

The MM field 46 and DM field 56 are both utilized for mirroring the write request data from the primary cache memory area 34 to the alternate cache memory area 42. In the described embodiment, the MM and DM fields 46, 56 are each 32-bits long. However, the length of the MM and DM fields 46, 56 could be less than or greater than 32-bits if so desired. Each of the 32-bits in the MM and DM fields 46, 56 represents one of the sectors within the particular cache block being represented. That is, each sector in the cache block is represented by one MM-bit in the MM field 46, and one DM-bit in the DM field 56.

If an MM-bit is set to one (1), that indicates that the write request data stored in the particular cache sector represented by the MM-bit has been copied or mirrored to the alternate cache memory area 42. If the MM-bit is set to zero (0), that indicates that the write request data stored in that cache sector has not been copied or mirrored to the alternate cache memory area 42.

If a DM-bit is set to one (1), that indicates that the write request data stored in the particular cache sector represented by the DM-bit has not been written to storage media, i.e. the disk array 26. If the DM-bit is set to (0), then the write request data stored in that cache sector has been written to storage media.

The remaining four fields of the RCBs 44, 45, namely fields 48, 50, 52 and 54, contain meta-data which defines (1) the type of data stored in the particular cache block represented by the RCBs, (2) what needs to be done with the data stored in the cache block and (3) where the data goes in the event that the data must be recovered after the occurrence of a fault.

Figure 3:
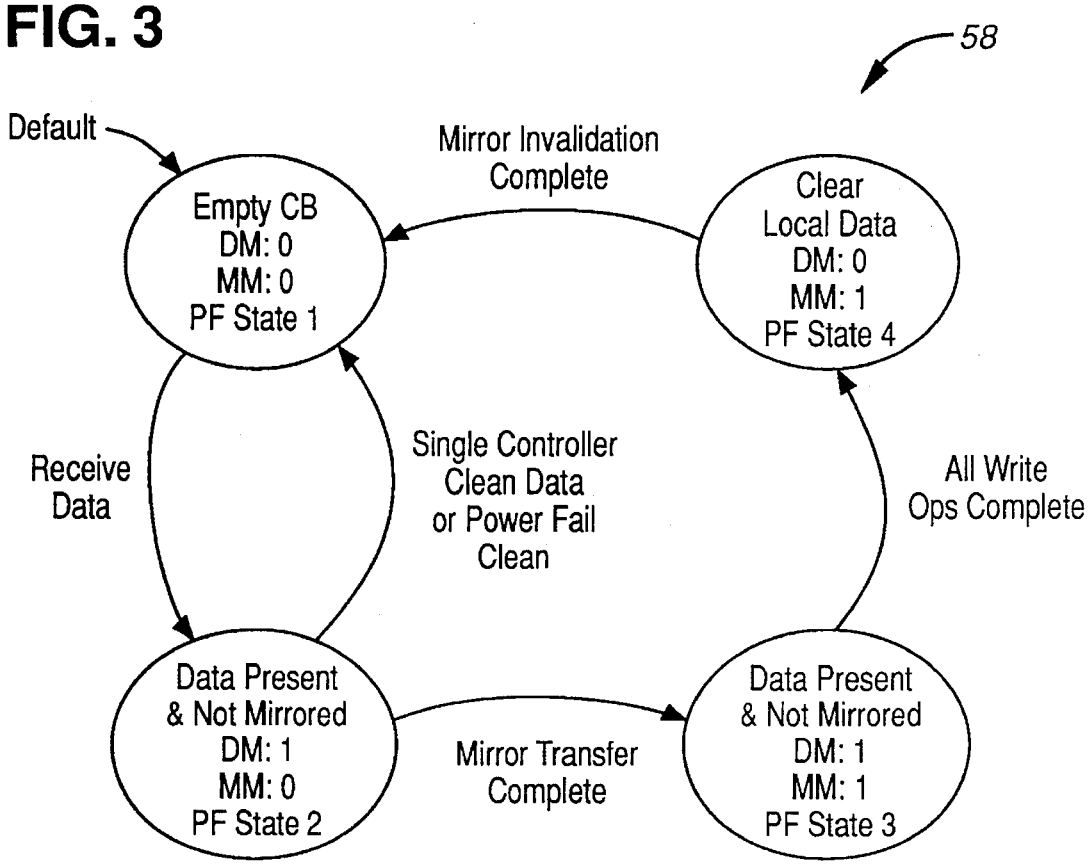
FIG. 3 is a recovery control block state machine diagram which describes the state of recovery control blocks and cache blocks associated with a primary controller of the disk array apparatus.

Referring now to FIG. 3, there is shown an RCB state machine 58 which describes the state of the MM and DM fields 46, 56 of the primary controller RCBs 44 and their associated cache blocks in the primary cache memory area 34. The state machine 58 describes a transition for each sector in a cache block. Thus, at any one moment in time, each of the sectors in the cache blocks may be in different states within the state machine 58.

The default state for the primary controller RCB state machine 58 is state 1 which assumes that the particular cache block represented by the RCB 44 is empty and is available for storing write request data. That is, all of the bits comprising the MM field 46 and DM field 56 are set to zero (0). The primary controller RCB state machine 58 transitions from state 1 to state 2 when the controller 18 stores the write request data within the primary cache memory area 34.

In state 2, the controller 18 sets the DM-bit to one (1) for every sector in which the write request data was stored. Thus, the controller 18 updates each RCB 44 to indicate that the particular cache block in the primary cache memory area 34 presently contains dirty data within the sectors having their DM-bits set to one (1), that the sectors having their DM-bits set to zero (0) have no write request data stored therein, and that the dirty data has not been mirrored to the alternate cache controller 42 (MM-bits remain set to zero (0)).

The primary controller RCB state machine 58 transitions to state 3 after the primary controller 18 has mirrored the dirty write request data into the alternate cache memory area 42. Alternatively, the primary controller RCB state machine 58 could transition from state 2 back to state 1 under certain circumstances, such as when the write request data is automatically flushed or written right-through to storage media without mirroring the write request data in the alternate cache memory area 42. Similarly, if power is lost while in state 2 before the write request data is mirrored to the alternate cache memory area 42, the state machine 58 will transition back to state 1 and the host computer 10 would be expected to retransmit the original write request data.

In state 3, the controller 18 sets the MM-bit to one (1) for every sector containing write request data which was mirrored to the alternate cache memory area 42. Thus, the controller 18 updates each RCB 44 to indicate that the particular cache block in the primary cache memory area 34 presently contains mirrored data within the sectors having their MM-bits set to one (1).

After the write request data is mirrored to the alternate cache memory area 42 of controller 20, the controller 18 sends status information to the host computer 10 indicating that the write request was successful. The controller 18 can then write the dirty data to the disk array 26 in accordance with any one of many known write caching algorithms. After the dirty data has been written to storage media, the primary controller RCB state machine 58 transitions to state 4.

In state 4, the controller sets the DM-bit to zero (0) for the sectors containing write request data which was written to storage media. Thus, the controller 18 updates each RCB 44 to indicate that the particular cache block in the primary cache memory area 34 presently contains write request data which has been written to storage media (hereinafter referred to as clean data) within the sectors having their DM-bits set to zero (0). Further, the RCBs also indicate that a mirror representation of the clean data is stored in the alternate cache memory area 42 as indicated by the sectors having their MM-bits still set to one (1). If power is lost while in the state 4, the RCBs 44 would indicate that the write request data was written to storage media and that the mirrored representation in the alternate cache memory area 42 should be invalidated so that the alternate cache memory area 42 can be made available for storing other mirrored representations.

After the DM-bits in the RCB 44 have been set to zero (0) for the sectors containing the clean data in state 4, there is no longer a need to maintain the mirrored representation in the alternate cache memory area 42. The controller 18 invalidates the mirrored representations stored in the alternate cache memory area 42 by setting the MM-bits in the alternate controller RCB 45 to zero (0) for the sectors in the RCB 45 that contain the mirrored representation of the clean data. The controller 18 then sets the corresponding MM-bits in the primary controller RCB 44 to zero (0). Thus, the controller 18 first updates the RCB 45 and then the RCB 44 during the transition from state 4 to state 0 to indicate that the particular cache block in the primary cache memory area 34 is presently empty, i.e. all MM-bits and DM-bits are set to zero (0).

Figure 4:
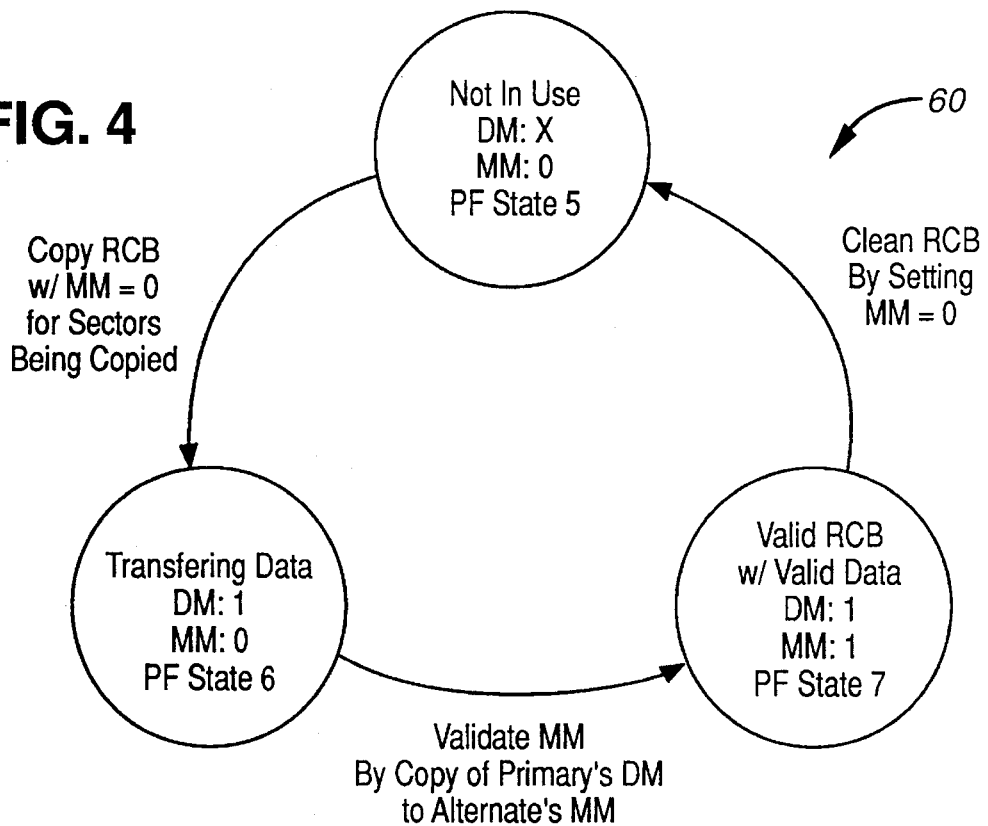
FIG. 4 is a recovery control block state machine diagram which describes the state of recovery control blocks and cache blocks associated with an alternate controller of the disk array apparatus.

Referring now to FIG. 4, there is shown an alternate controller RCB state machine 60 which describes the states of the MM and DM fields 46, 56 of the alternate controller RCBs 45 which are set up and maintained in the alternate cache memory area 42 to indicate the status of the mirrored cache blocks in the alternate cache memory area 42. The state diagram 60 describes a transition for each sector in a mirrored cache block represented by the RCB 45. Thus, at any one moment in time, each of the sectors in the mirrored cache block may be in different states within the alternate controller state machine 60.

The default state for the alternate controller RCB state machine 60 is state 5. In state 5, the DM-bits are ignored and the MM-bits are set to zero (0) which indicate that the sectors within the particular cache block are not being used and are available for storing mirrored write request data.

Figure 5:
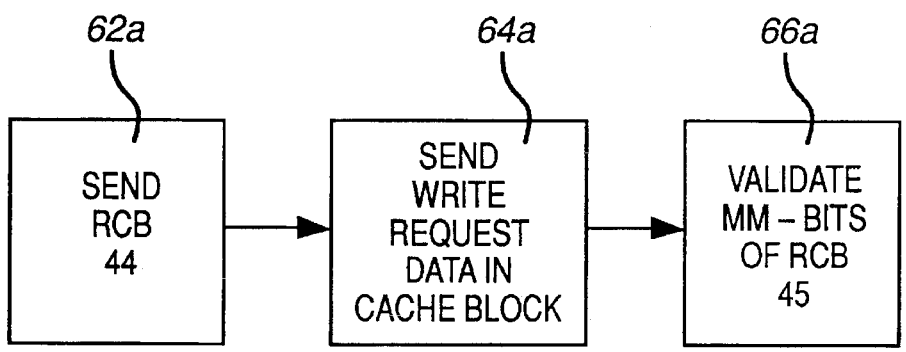
FIG. 5 is a flow chart illustrating the sequence of steps required to transfer one cache block containing write request data from the primary controller to the alternate controller in accordance with the method of the present invention.

Referring now to FIG. 5 there is shown a flow chart illustrating the sequence of steps required to transfer a single cache block containing write request data from the primary controller 18 to the alternate controller 20. As previously mentioned, the cache block sectors containing unwritten write request data are transferred to the alternate cache memory area 42 during the transition from state 2 to state 3 of the primary controller state machine 58 (FIG. 3).

Initially, as shown in step 62a, a copy of the RCB 44 representing a cache block containing the write request data to be mirrored is sent to the alternate controller 20 in order to update or establish the RCB 45 before the actual write request data is copied into the alternate cache memory area 42. Thus, the MM-bits for the cache block sectors containing previously mirrored write request data, if any, remain set to one (1), and the MM-bits for the cache block sectors containing unmirrored write request data will be set to zero (0) in both RCBs 44 and 45. If a power failure occurs after step 62a is complete, the RCBs 44, 45 would indicate that the unwritten write request data was not mirrored into the alternate cache memory area 42 prior to the power interruption.

In step 66a, the MM-bits in the RCB 45 are validated (set to one (1)) for the cache block sectors containing the write request data that was mirrored into the alternate cache memory area 42. More specifically, the DM-field in the RCB 44 is copied into the MM-field in the RCB 45. Setting the MM-bits in the RCB 45 to one (1) transitions the alternate controller RCB state machine 60 from state 6 to state 7 as shown in FIG. 4. In state 7, the sectors containing mirrored write request data have the MM-bit set to one (1) and the DM-bit set to one (1) thereby indicating that valid dirty data is stored in the alternate cache memory area 42. If power is lost and/or the primary controller 18 fails after step 66a is completed, then the write request data could be reclaimed from the alternate cache memory area 42.

Figure 6:
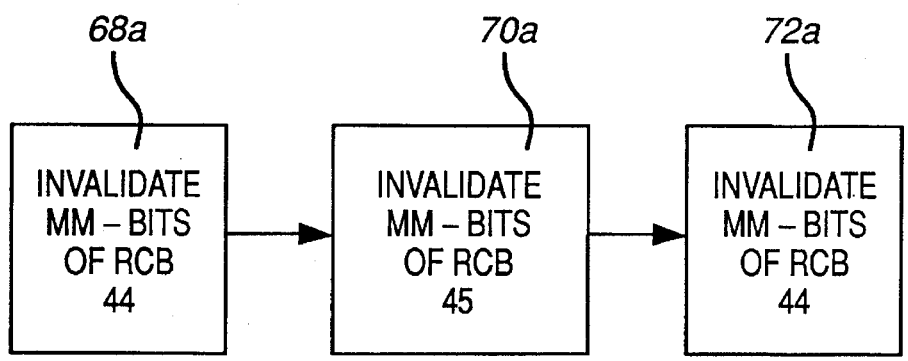
FIG. 6 is a flow chart illustrating a sequence of steps for invalidating a recovery control block associated with the alternate controller in accordance with the method of the present invention.

Referring now to FIG. 6, there is shown a flow chart illustrating the sequence of steps required to invalidate the RCB 45 associated with the alternate controller 20 after the primary controller writes the dirty data to storage media. In step 68a, the primary controller RCB state machine 58 sets the DM-bits in the RCB 44 to zero (0) which corresponds to state 4 of the primary controller RCB state machine 58. In step 70a, the MM-bits in the RCB 45 are invalidated or set to zero (0), thus freeing up that particular portion of the alternate cache memory area 42 for further use. The alternate controller RCB state machine 60 transitions from state 7 to state 5 during execution of step 70a. In step 72a, the MM-bits in the RCB 44 are set to zero (0) and the primary controller RCB state machine 58 transitions from state 4 to the default state 1.

Figure 7A:
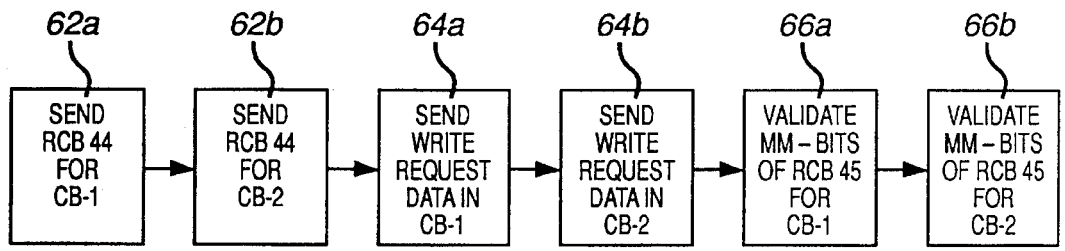
FIGS. 7A and 7B are flow charts illustrating alternative sequences of steps for transferring a plurality of cache blocks containing write request data from the primary controller to the alternate controller in accordance with the method of the present invention.

Referring now to FIG. 7A, there is shown a flow chart illustrating the sequence of steps to transfer a plurality of cache blocks containing write request data from the primary controller 18 to the alternate controller 20. When transferring multiple cache blocks, the RCBs 44 for the cache blocks to be mirrored are sequentially copied to the alternate cache memory area 42 prior to sequentially transferring the cache blocks to the alternate cache memory area 42. That is, the RCB 44 for the first cache block (CB-1) is copied or transferred in step 62a and the RCB 44 for the second cache block (CB-2) is copied or transferred in step 62b. The first and second cache blocks CB-1 and CB-2 are then transferred in the same order as the corresponding RCBs. Thus, the cache block CB-1 is transferred in step 64a, and the cache block CB-2 is transferred in step 64b. Lastly, the MM-bits for the RCBs 45 are validated (set to one (1)) in the same order as copying or transferring the corresponding RCBs 44. Thus, the relevant MM-bits in the RCB 45 representing the first cache block CB-1 are set to one (1) in step 66a, and the relevant MM-bits in the RCB 45 representing the second cache block CB-2 are set to one (1) in step 66b.

Figure 7B:
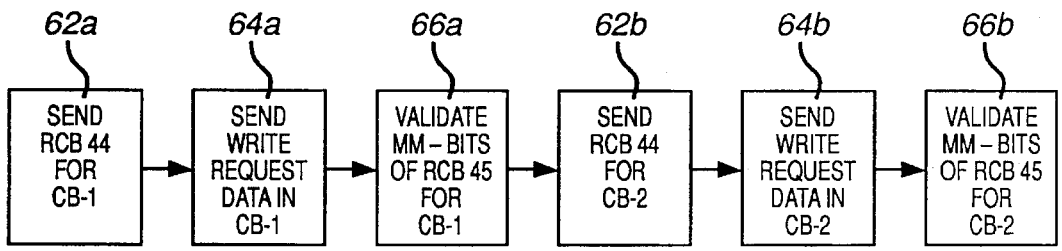

Referring now to FIG. 7B, there is shown a flow chart illustrating an alternate sequence of steps to transfer a plurality of cache blocks containing write request data from the primary controller 18 to the alternate controller 20. When transferring multiple cache blocks, all of the steps associated with the first cache block CB-1 are performed before performing the steps associated with the second cache block CB-2. Thus, the RCB 44 representing the first cache block (CB-1) is copied or transferred in step 62a. The first cache block CB-1 is copied or transferred in step 64a, and then the MM-bits for the RCB 45 representing the first cache block CB-1 are validated (set to one (1)) in step 66a. The RCB 44 for the second cache block (CB-2) is copied or transferred in step 62b. The second cache block CB-2 is copied or transferred in step 64b, and the MM-bits for the RCB 45 representing the second cache block CB-2 are validated or set to one (1) in step 66b.

Figure 8:
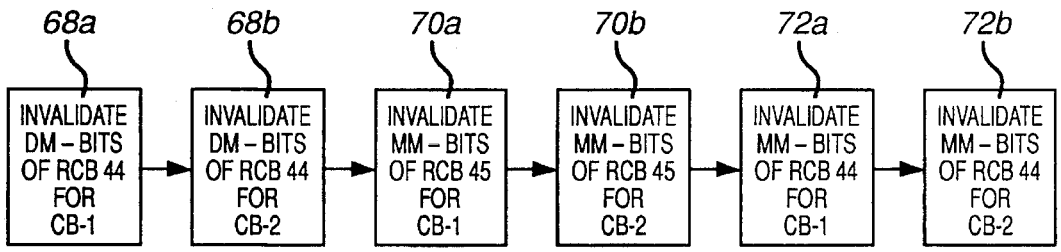
FIG. 8 is a flow chart illustrating a sequence of steps for invalidating a plurality of recovery control blocks associated with the alternate controller in accordance with the method of the present invention.

FIG. 8 is a flow chart illustrating the sequence of steps for invalidating the MM-bits in a plurality of RCBs 45 associated with the alternate controller 20. The DM-bits in the RCB 44 representing the first cache block CB-1 are invalidated or set to zero (0) in step 68a, and the DM-bits in the RCB representing the second cache block CB-2 are invalidated or set to zero (0) in step 68b. The MM-bits in the RCB 45 representing the first cache block CB-1 are invalidated or set to zero (0) in step 70a, and the MM-bits in the RCB 45 representing the second cache block CB-2 are invalidated or set to zero (0) in step 70b. The MM-bits in the RCB 44 representing the first cache block CB-1 are invalidated or set to zero (0) in step 72a, and the MM-bits in the RCB 44 representing the second cache block CB-2 are invalidated or set to zero (0) in step 72b.

While the invention has been illustrated and described in detail in the drawings and foregoing description, such illustration and description is to be considered as exemplary and not restrictive in character, it being understood that only the preferred embodiment has been shown and described and that all changes and modifications that come within the spirit of the invention are desired to be protected.

What is claimed is:

1. A method of insuring recovery of a quantity of write request data in a computer system having a host device and a storage device, with the storage device having a first controller and a second controller, comprising the steps of:

transferring the write request data from said host device to said first controller so as to store the write request data therein;

allocating a memory area in said second controller for use by said first controller; and maintaining a control block in said second controller for indicating status of the write request data stored in said first controller.

2. The method of claim 1, further comprising the steps of:

copying the write request data from said first controller to said memory area of said second controller; and updating said control block to indicate that the write request data was copied from said first controller to said memory area of said second controller.

3. The method of claim 2, further comprising the steps of:

copying the write request data from said first controller to a storage medium; and updating said control block to indicate that the write request data was copied from said first controller to said storage medium.

4. The method of claim 1, wherein:

said transferring step includes the step of transferring the write request data from said host device to a first cache memory of said first controller so as to store the write request data therein;

said allocating step includes the step of allocating said memory area in a second cache memory of said second controller for use by said first controller, and said maintaining step includes the step of maintaining said control block in said second cache memory of said second controller for indicating status of the write request data stored in said first cache memory of said first controller.

5. The method of claim 4, further comprising the steps of:

copying the write request data from said first cache memory of said first controller to said memory area of said second cache memory of said second controller, and updating said control block to indicate that the write request data was copied from said first cache memory of said first controller to said memory area of said second cache memory of said second controller.

6. The method of claim 5, further comprising the steps of:

copying the write request data from said first cache memory of said first controller to a storage medium, and updating said control block to indicate that the write request data was copied from said first cache memory of said first controller to said storage medium.

7. The method of claim 1, wherein:

said storage device includes a peripheral disk drive apparatus, and said peripheral disk drive apparatus includes said first controller and said second controller.

8. A method of insuring recovery of a quantity of write request data in a computer system having a host device and a storage device, with the storage device having a primary controller and an alternate controller, comprising the steps of:

transferring the write request data from said host device to a first memory area in said primary controller so as to store the write request data therein;

allocating a second memory area in said alternate controller for use by said primary controller;

maintaining a first control block in said primary controller for indicating status of the write request data stored in said primary controller; and maintaining a second control block in said alternate controller for indicating status of the write request data stored in said primary controller.

9. The method of claim 8, further comprising the step of:

updating said first control block to indicate that the write request data was transferred from said host device to said first memory area of said primary controller.

10. The method of claim 9, wherein the step of updating said first control block to indicate that the write request data was transferred from said host device to said first memory area of said primary controller includes the step of:

setting a bit in the first control block to a particular value.

11. The method of claim 9, further comprising the step of:

updating said second control block to indicate that the write request data was transferred from said host device to said first memory area of said primary controller.

12. The method of claim 11, wherein the step of updating said second control block to indicate that the write request data was transferred from said host device to said first memory area of said primary controller includes the step of:

setting a bit in the second control block to a particular value.

13. The method of claim 11, wherein said first control block is identical to said second control block after said step of updating said second control block to indicate that the write request data was transferred from said host device to said first memory area of said primary controller.

14. The method of claim 11, further comprising the steps of:

copying the write request data from said first memory area of said primary controller to said second memory area of said alternate controller; and updating said second control block to indicate that said write request data was copied from said first memory area of said primary controller to said second memory area of said alternate controller.

15. The method of claim 14, wherein the step of updating said second control block to indicate that the write request data was copied from said first memory area of said primary controller to said second memory area of said alternate controller includes the step of:

setting a bit in the second control block to a particular value.

16. The method of claim 14, further comprising the step of:

updating said first control block to indicate that said write request data was copied from said first memory area of said primary controller to said second memory area of said alternate controller.

17. The method of claim 16, wherein the step of updating said first control block to indicate that the write request data was copied from said first memory area of said primary controller to said second memory area of said alternate controller includes the step of:

setting a bit in the first control block to a particular value.

18. The method of claim 16, wherein said first control block is identical to said second control block after said step of updating said first control block to indicate that said write request data was copied from said first memory area of said primary controller to said second memory area of said alternate controller.

19. The method of claim 16, wherein the step of updating said first control block to indicate that the write request data was copied from said first memory area of said primary controller to said second memory area of said alternate controller is performed before the step of updating said second control block to indicate that the write request data was copied from said first memory area of said primary controller to said second memory area of said alternate controller.

20. The method of claim 19, further comprising the steps of:

copying the write request data from said first memory area of said primary controller to a storage medium; and updating said first control block to indicate that the write request data was copied from said first memory area of said primary controller to said storage medium.

21. The method of claim 20, wherein the step of updating said first control block to indicate that the write request data was copied from said first memory area of said primary controller to said storage medium includes the step of:

setting a bit in the first control block to a particular value.

22. The method of claim 20, further comprising the step of:

updating said second control block to indicate that the write request data was copied from said first memory area of said primary controller to said storage medium.

23. The method of claim 22, wherein the step of updating said second control block to indicate that the write request data was copied from said first memory area of said primary controller to said storage medium includes the step of:

setting a bit in the second control block to a particular value.

24. The method of claim 22, wherein said first control block is identical to said second control block after said step of updating the second control block to indicate that the write request data was copied from said first memory area of said primary controller to said storage medium.

25. The method of claim 22, further comprising the step of:

updating said first control block to indicate that said first memory area of said primary controller is available for storing another quantity of write request data received from said host device.

26. The method of claim 25, wherein the step of updating said first control block to indicate that said first memory area of said primary controller is available for storing another quantity of write request data from said host device includes the step of:

setting a bit in the first control block to a particular value.

27. The method of claim 8, wherein:

said storage device includes a peripheral disk drive apparatus, and said peripheral disk drive apparatus includes said primary controller and said alternate controller.

28. The method of claim 8, wherein:

said transferring step includes the step of transferring the write request data from said host device to a first memory area in a first cache memory of said primary controller so as to store the write request data therein;

said allocating step includes the step of allocating a second memory area in a second cache memory of said alternate controller for use by said primary controller;

maintaining a first control block in said first cache memory of said primary controller for indicating status of the write request data stored in said first cache memory of said primary controller; and maintaining a second control block in said second cache memory of said alternate controller for indicating status of the write request data stored in said first cache memory of said primary controller.

29. A program storage device readable by a machine, tangibly embodying a program or instructions executable by the machine to perform method steps for insuring recovery of a quantity of write request data in a computer system having a host device and a storage device, with the storage device having a first controller and a second controller, said method steps comprising:

transferring the write request data from said host device to said first controller so as to store the write request data therein;

allocating a memory area in said second controller for use by said first controller; and maintaining a control block in said second controller for indicating status of the write request data stored in said first controller.

30. The method of claim 29, wherein:

said storage device includes a peripheral disk drive apparatus, and said peripheral disk drive apparatus includes said first controller and said second controller.

31. The method of claim 29, wherein:

said transferring step includes the step of transferring the write request data from said host device to a first cache memory of said first controller so as to store the write request data therein;

said allocating step includes the step of allocating said memory area in a second cache memory of said second controller for use by said first controller, and said maintaining step includes the step of maintaining said control block in said second cache memory of said second controller for indicating status of the write request data stored in said first cache memory of said first controller.

\* \* \* \* \*